United States Patent
Kimura

(10) Patent No.: US 7,709,060 B2
(45) Date of Patent: May 4, 2010

(54) DROPLET SPRAYING AND APPLYING HEAD MODULE, DROPLET SPRAYING AND APPLYING APPARATUS, AND METHOD OF MANUFACTURING COATED BODY

(75) Inventor: Shuichi Kimura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 725 days.

(21) Appl. No.: 11/533,666

(22) Filed: Sep. 20, 2006

(65) Prior Publication Data
US 2007/0215041 A1 Sep. 20, 2007

(30) Foreign Application Priority Data
Mar. 20, 2006 (JP) ............................ 2006-076652

(51) Int. Cl.
*B05D 1/02* (2006.01)
*B05B 1/08* (2006.01)
*B05B 7/06* (2006.01)
*B05B 3/04* (2006.01)
*B05C 5/00* (2006.01)

(52) U.S. Cl. .................. 427/421.1; 118/305; 118/313; 239/102.2; 239/553; 427/424; 347/85; 347/89; 347/92; 347/93; 347/107

(58) Field of Classification Search .............. 427/421.1, 427/424; 118/305, 313; 239/102.2, 553; 347/85, 89, 92, 93, 107
See application file for complete search history.

(56) References Cited

U.S. PATENT DOCUMENTS 5,975,330 A 11/1999 Sasaki et al.
6,224,201 B1 * 5/2001 Shigemura ................... 347/93

FOREIGN PATENT DOCUMENTS

| CN | 1059157 C | 12/2000 |
|---|---|---|
| JP | 8-11448 | 2/1996 |
| JP | 9-267483 | 10/1997 |
| JP | 2004-31070 | 1/2004 |
| JP | 2004031070 A * | 1/2004 |
| KR | 1999-014249 | 2/1999 |
| KR | 10-0222280 | 10/1999 |

* cited by examiner

*Primary Examiner*—Michael Kornakov
*Assistant Examiner*—Alexander Weddle
(74) *Attorney, Agent, or Firm*—Oblon, Spivak, McClelland, Maier & Neustadt, L.L.P.

(57) ABSTRACT

The present invention aims at making it possible to easily fill liquid into a droplet spraying and applying head module, while saving work. The droplet spraying and applying head module includes a droplet spraying and applying head and a tank. The droplet spraying and applying head includes a liquid chamber for containing liquid and a plurality of nozzles communicating with the liquid chamber, and sprays droplets through the nozzles The tank contains liquid to be supplied to the liquid chamber, and communicates with the liquid chamber. The droplet spraying and applying head and the tank are coupled to each other with a coupling member. A revolute joint is interposed between the coupling member and the droplet spraying and applying head.

2 Claims, 6 Drawing Sheets

DROPLET SPRAYING AND APPLYING HEAD MODULE, DROPLET SPRAYING AND APPLYING APPARATUS, AND METHOD OF MANUFACTURING COATED BODY

CROSS REFERENCE TO RELATED APPLICATION

This application is based upon and claims the benefit of priority from the prior Japanese Patent Application No. 2006-076652, filed on Mar. 20, 2006, the entire content of which is incorporated herein by reference.

BACKGROUND OF THE INVENTION

1. Field of the Invention

The present invention relates to a droplet spraying and applying head module, a droplet spraying and applying apparatus, and a method of manufacturing a coated body. In particular, the present invention relates to: a droplet spraying and applying head module used for manufacturing a coated body such as a liquid crystal display panel or an organic electroluminescence (EL) display panel; a droplet spraying and applying apparatus including this droplet spraying and applying head module; and a method of manufacturing a coated body by using this droplet spraying and applying apparatus.

2. Description of the Prior Art

As described in Japanese Unexamined Patent Publication No. 2004-31070, a droplet spraying and applying apparatus is known which is used for manufacturing an organic EL display panel.

In this droplet spraying and applying apparatus, liquid made by dissolving coloring matter such as polymer luminescent material in a solvent is sprayed as droplets through nozzles of a droplet spraying and applying head, and the sprayed droplets are applied to a substrate surface. Then, by evaporating the solvent in the droplets applied to the substrate surface, a film formed of the coloring matter remains on the substrate. Thus, an organic EL display panel is manufactured.

In such a droplet spraying and applying apparatus, there are some cases of using a droplet spraying and applying head module 100 such as shown in FIG. 6.

This droplet spraying and applying head module 100 includes a droplet spraying and applying head 101, a buffer tank 102, and an apparatus fixation portion 103. The droplet spraying and applying head 101 and the apparatus fixation portion 103 are screwed to each other, and the droplet spraying and applying head 101 and the buffer tank 102 are connected to each other with a flexible supply pipe 104.

The droplet spraying and applying head 101 includes a casing 105 and a nozzle plate 106 fixed to one side of the casing 105. In the casing 105, a plurality of liquid chambers (not shown) are formed, and a plurality of piezoelectric elements (not shown) are provided corresponding to the respective liquid chambers. In the nozzle plate 106, a nozzle (not shown) is formed for each liquid chamber.

The buffer tank 102 contains liquid (e.g., ink) made by dissolving coloring matter in a solvent. This liquid is supplied through the supply pipe 104 to the liquid chambers in the casing 105. A main tank (not shown) is connected to the buffer tank 102, and the buffer tank 102 is replenished with the liquid from the main tank.

In the case where the droplet spraying and applying head module 100 is attached to the droplet spraying and applying apparatus, before this attachment, the liquid is filled into the droplet spraying and applying head module 100. In the case where the liquid is filled into the droplet spraying and applying head module 100, bubbles are prone to enter the liquid chambers and the nozzles. The bubbles which have entered therein need to be removed.

Accordingly, in order to remove these bubbles, the work of filling liquid into the droplet spraying and applying head module 100 is performed with the droplet spraying and applying head module 100 attached to a filling jig. In the droplet spraying and applying head module 100 attached to the filling jig, the buffer tank 102 is fixed in place, and the droplet spraying and applying head 101 can rotate in a vertical plane.

After the liquid is filled into the droplet spraying and applying head module 100 attached to the filling jig, the droplet spraying and applying head 101 is rotated in the vertical plane. This rotation moves bubbles existing in the liquid chambers and the nozzles toward an exhaust port 107 provided in such a way that the exhaust port 107 is connected to the liquid chambers. By opening the exhaust port 107, the bubbles are expelled outside the droplet spraying and applying head 101.

Thus the flexible supply pipe 104 connecting the droplet spraying and applying head 101 to the buffer tank 102 has a length enough not to cause any problem even when the droplet spraying and applying head 101 is rotated in the vertical plane.

After the droplet spraying and applying head 101 attached to the filling jig is rotated and the bubbles are expelled through the exhaust port 107, a purging process for causing liquid to flow out through the nozzles is performed. In this purging process, the droplet spraying and applying head 101 is rotated to a position where the nozzles point upward, and a pressure is applied to the inside of the buffer tank 102, thereby causing liquid to flow out through the nozzles. In the case where the bubbles remain in the liquid chambers and the nozzles, this purging process expels the bubbles together with the liquid through the nozzles.

After the process of expelling the bubbles through the exhaust port 107 by rotating the droplet spraying and applying head 101, and the purging process for causing the liquid to flow out through the nozzles are finished, the droplet spraying and applying head module 100 is detached from the filling jig, and then is attached to the droplet spraying and applying apparatus.

After the bubble expelling process and the purging process are finished, no bubbles exist in the liquid filled in the droplet spraying and applying head module 100. Accordingly, droplets can be sprayed through the nozzles of the droplet spraying and applying head 101 without causing failure of spray or defective spray. The droplet spraying and applying head 101 is part of the droplet spraying and applying head module 100 attached to the droplet spraying and applying apparatus.

However, in the above-described droplet spraying and applying head module 100 and the droplet spraying and applying apparatus employing this droplet spraying and applying head module, no consideration is given to the following points.

When the droplet spraying and applying head module 100 is attached to or detached from the filling jig or when the droplet spraying and applying head module 100 is attached to the droplet spraying and applying apparatus, the droplet spraying and applying head 101 and the buffer tank 102 are individually attached or detached. This requires a lot of labor.

Moreover, since the supply pipe 104 connecting the droplet spraying and applying head 101 to the buffer tank 102 is long, the supply pipe 104 is prone to hit against the other members during the work of detaching the droplet spraying and applying head module 100 from the filling jig and of attaching the droplet spraying and applying head module 100 to the droplet spraying and applying apparatus. If the supply pipe 104 hits against the other members during this work, pressure fluctuation occurs in liquid in the droplet spraying and applying head module 100 due to the hit. There are some cases where gas is sucked in through the tips of the nozzles due to this pressure fluctuation. The sucked-in gas causes failure of spray or defective spray of droplets through the nozzles.

SUMMARY OF THE INVENTION

The present invention has been accomplished to solve the above-described problems. An object of the present invention is to provide: a droplet spraying and applying head module into which liquid containing no gas can be easily filled, while saving work; a droplet spraying and applying apparatus employing this droplet spraying and applying head module; and a method of manufacturing a coated body by using this droplet spraying and applying apparatus.

A first feature of an embodiment of the present invention is as follows. A droplet spraying and applying head module includes a droplet spraying and applying head and a tank. The droplet spraying and applying head includes a liquid chamber for containing liquid and a plurality of nozzles communicating with the liquid chamber. The droplet spraying and applying head sprays droplets through the nozzles. The tank contains liquid to be supplied to the liquid chamber, and communicates with the liquid chamber. The droplet spraying and applying head and the tank are coupled to each other with a coupling member. Then, the droplet spraying and applying head is coupled to the coupling member with a revolute joint.

A second feature of the embodiment of the present invention is that a droplet spraying and applying apparatus is equipped with the following: a supporting portion for supporting the droplet spraying and applying head module described in the first feature of the embodiment of the present invention; and a holding portion for holding a body to be coated with the droplets sprayed through the nozzles.

A third feature of the embodiment of the present invention is as follows: in a method of manufacturing a coated body, droplets are sprayed and applied to a body to be coated, by using the droplet spraying and applying apparatus described in the second feature of the embodiment of the present invention.

According to the present invention, liquid containing no bubbles can be easily filled into a droplet spraying and applying head module, while saving work. Thereby droplets can be favorably sprayed and applied by using this droplet spraying and applying head module.

DESCRIPTION OF THE PREFERRED EMBODIMENTS

Hereinafter, an embodiment of the present invention will be described by using drawings.

Figure 1:
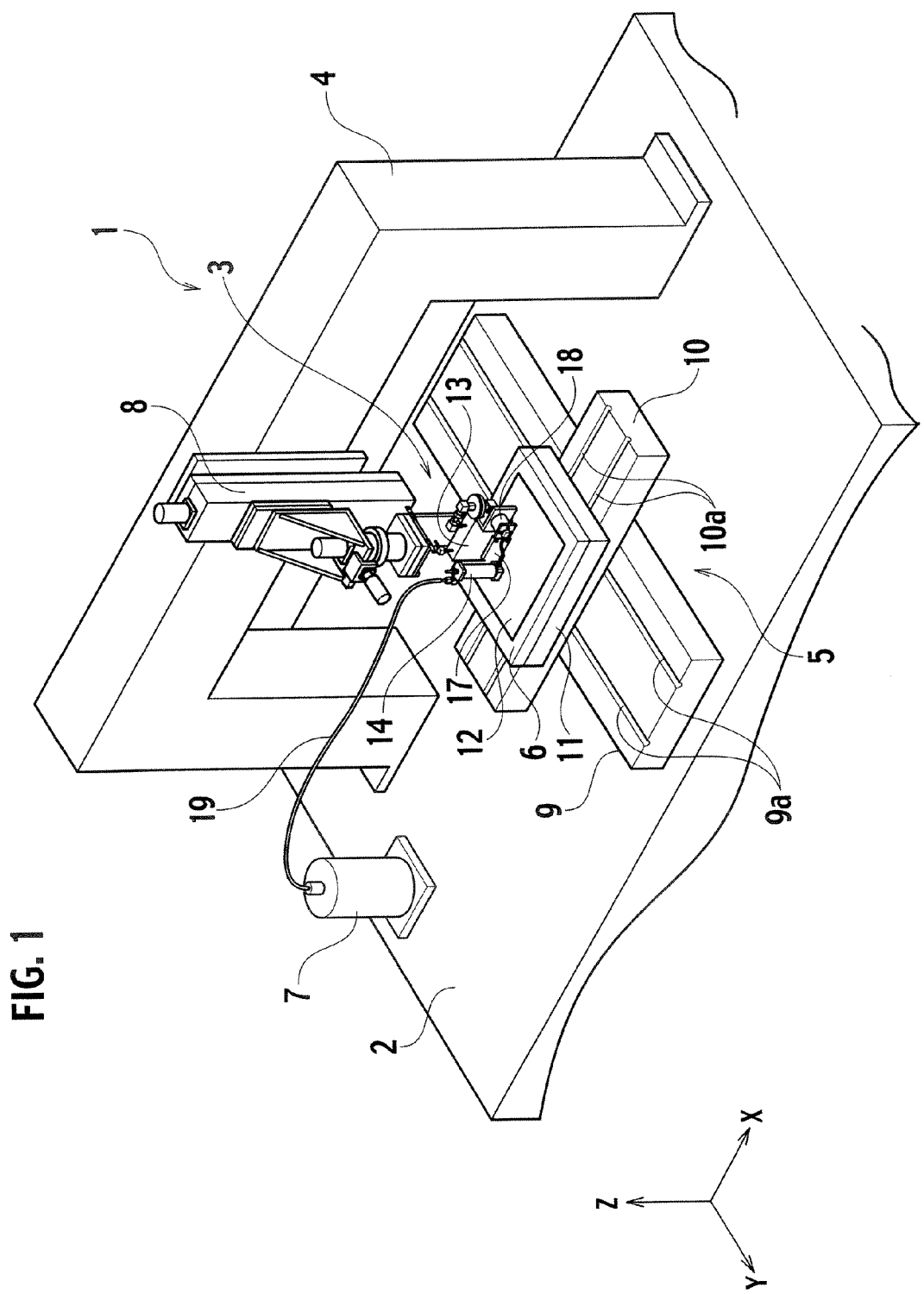
FIG. 1 is a perspective view showing the schematic constitution of a droplet spraying and applying apparatus according to an embodiment of the present invention.

A droplet spraying and applying apparatus 1 according to the embodiment of the present invention contains ink which is liquid, and sprays the ink as droplets. The droplet spraying and applying apparatus 1 is an apparatus used for manufacturing an organic EL display panel, which is a coated body, by applying the sprayed droplets to a substrate, which is a body to be coated. Furthermore, this droplet spraying and applying apparatus 1 is an apparatus used for forming a black frame around a region in which color films of three colors (R (red), G (green), and B (blue)) are formed in the organic EL display panel. Accordingly, the ink sprayed as droplets from the droplet spraying and applying apparatus 1 is black ink only. As shown in FIG. 1, the droplet spraying and applying apparatus 1 includes a base 2, a droplet spraying and applying head module 3, a supporting portion 4, a moving mechanism 5, and a substrate holding table 6 which is a holding portion.

On the upper surface of the base 2, the supporting portion 4, the moving mechanism 5, and a main tank 7 are installed. The supporting portion 4 is formed in a shape of a gate and fixed at a position where it straddles the moving mechanism 5. An elevating member 8 is attached to the supporting portion 4 in a movable manner in the Z-axis direction (vertical direction). The elevating member 8 is driven to move up and down by a motor (not shown). The droplet spraying and applying head module 3 is attached to the elevating member 8. The main tank 7 contains black ink which is liquid. This ink is fabricated by dissolving black coloring matter in a solvent.

The moving mechanism 5 includes a Y-axis direction guide plate 9, a Y-axis direction moving table 10, an X-axis direction moving table 11, and the substrate holding table 6.

The Y-axis direction guide plate 9 is fixed on the upper surface of the base 2. Guide grooves 9a are formed in the upper surface of the Y-axis direction guide plate 9, and extend in the Y-axis direction.

The Y-axis direction moving table 10 is placed on the Y-axis direction guide plate 9. The lower surface of the Y-axis direction moving table 10 has protruding portions (not shown) formed thereon. These protruding portions (not shown) are fitted in the respective guide grooves 9a. The Y-axis direction moving table 10 is provided in such a way that the Y-axis direction moving table 10 can be moved along the guide grooves 9a in the Y-axis direction by a conveyance mechanism (not shown) which employs a conveyance screw and a drive motor. On the upper surface of the Y-axis direction moving table 10, guide grooves 10a extending in the X-axis direction are formed.

The X-axis direction moving table 11 is placed on the Y-axis direction moving table 10. Protruding portions (not shown) are formed on the lower surface of the X-axis direction moving table 11. These protruding portions (not shown) are fitted in the respective guide grooves 10a. The X-axis direction moving table 11 is provided so that the X-axis direction moving table 11 can be moved along the guide grooves 10a in the X-axis direction by a conveyance mechanism (not shown) which employs a conveyance screw and a drive motor.

The substrate holding table 6 is fixed on the upper surface of the X-axis direction moving table 11. On the upper surface of the substrate holding table 6, a substrate 12, which is a body to be coated, is mounted. The substrate 12 mounted on the upper surface of the substrate holding table 6 is stuck and held by an absorption mechanism (not shown) provided in the substrate holding table 6.

The substrate holding table 6 can move in the Y-axis direction on the Y-axis direction guide plate 9 together with the X-axis direction moving table 11 and Y-axis direction moving table 10. The substrate holding table 6 can move between a position (position shown in FIG. 1) where the substrate 12 mounted on the substrate holding table 6 is positioned under the droplet spraying and applying head module 3, and where droplets are sprayed and applied to the substrate 12, and a position which is away from under the droplet spraying and applying head module 3 in the Y-axis direction, and at which the substrate 12 is loaded or unloaded.

Figure 2:
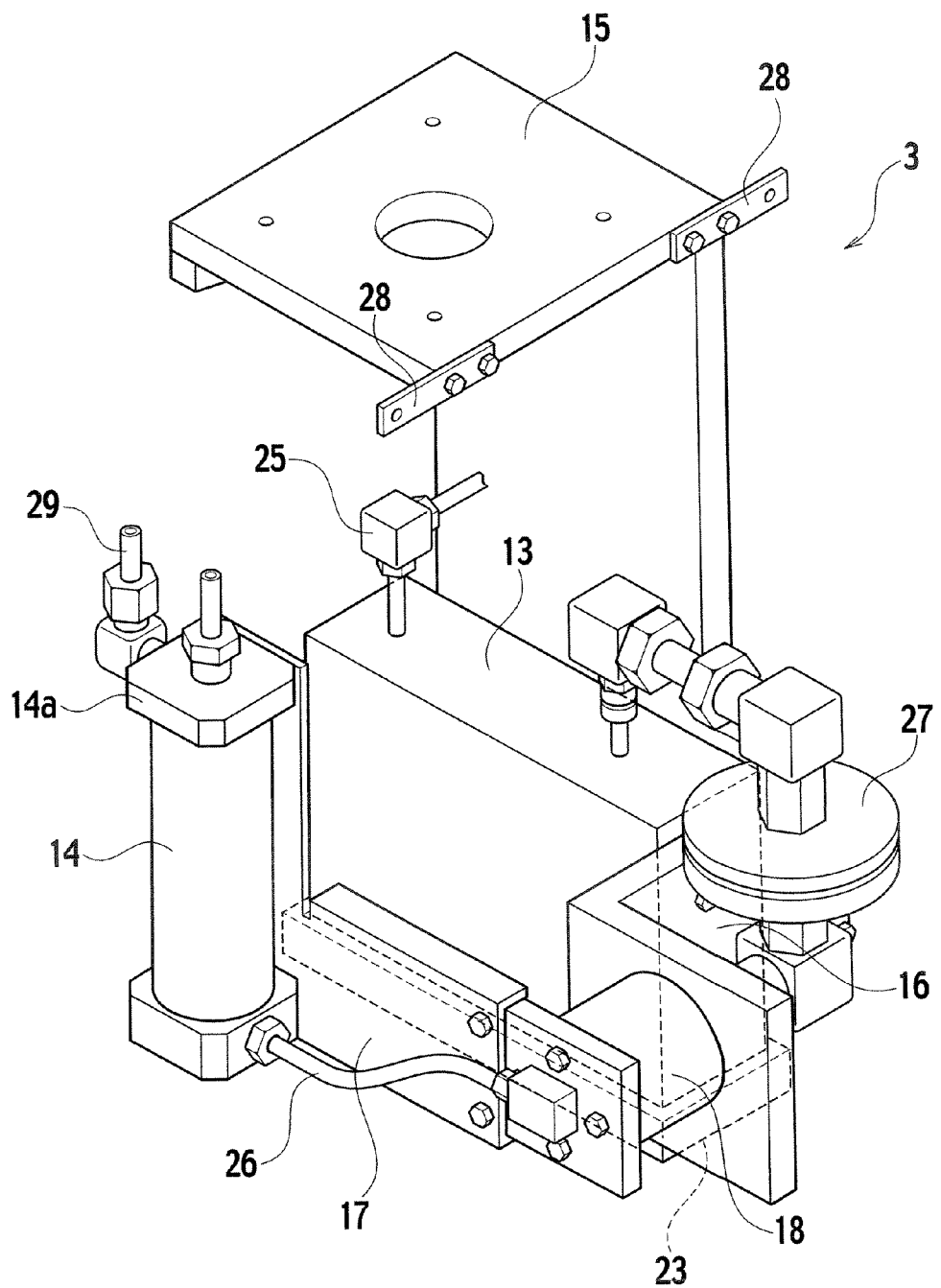
FIG. 2 is a perspective view showing a droplet spraying and applying head module installed in the droplet spraying and applying apparatus shown in FIG. 1.

As shown in FIG. 2, the droplet spraying and applying head module 3 includes a droplet spraying and applying head 13, a buffer tank 14 which is a tank, and an apparatus fixation portion 15. A supporting plate 16 is screwed to the droplet spraying and applying head 13 and the apparatus fixation portion 15, thereby integrating the droplet spraying and applying head 13 and the apparatus fixation portion 15. The droplet spraying and applying head 13 and the buffer tank 14 are coupled to each other with a coupling member 17. The buffer tank 14 and the coupling member 17 are coupled by screwing an upper frame portion 14a provided at the upper end of the buffer tank 14 and one end of the coupling member 17 to each other. The supporting plate 16 is screwed to the droplet spraying and applying head 13. The supporting plate 16 and the coupling member 17 are coupled to each other by a revolute joint 18. The provision of this revolute joint 18 enables the droplet spraying and applying head 13 and the apparatus fixation portion 15 to rotate about the center axis of the revolute joint 18 with respect to the coupling member 17.

As shown in FIG. 1, in the case where the droplet spraying and applying apparatus 1 has a constitution in which the droplet spraying and applying head module 3 is attached to the elevating member 8, the buffer tank 14 and the main tank 7 are connected to each other with a replenishing pipe 19. The ink in the main tank 7 is replenished through the replenishing pipe 19 into the buffer tank 14. The ink replenished in the buffer tank 14 is supplied through an undermentioned supply pipe 26 to undermentioned liquid chambers 20 in the droplet spraying and applying head 13.

Figure 3:
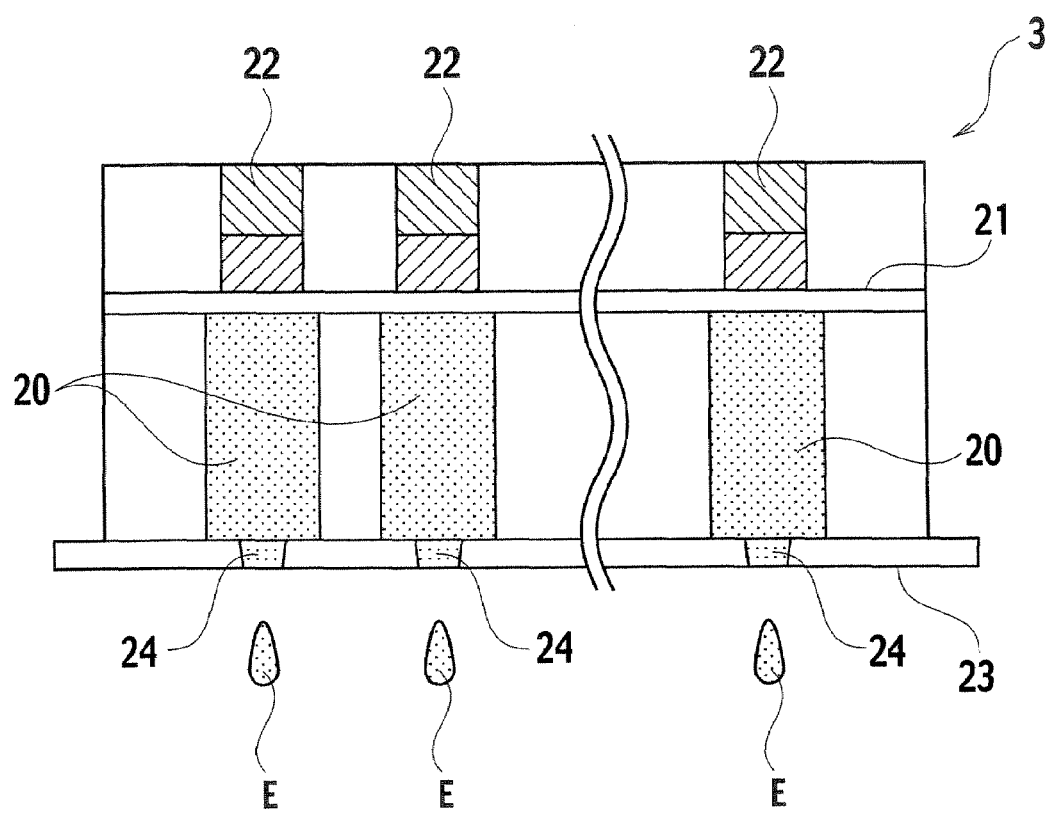
FIG. 3 is a cross-sectional view showing the structure of a droplet spraying and applying head, which is part of the droplet spraying and applying head module shown in FIG. 2.

As shown in FIG. 3, the droplet spraying and applying head 13 includes: the plurality of liquid chambers 20 for containing the ink supplied from the buffer tank 14; a diaphragm 21 forming portions of walls of the liquid chambers 20; a plurality of piezoelectric elements 22 each provided at a position in contact with the diaphragm 21, and each corresponding to each of the liquid chambers 20; and a nozzle plate 23 forming portions of walls of the liquid chambers 20. A plurality of nozzles 24 are formed in the nozzle plate 23, and communicate with the respective liquid chambers 20. In addition, an exhaust port 25 connected to the liquid chambers 20 is provided in the droplet spraying and applying head 13.

In the droplet spraying and applying head 13, the piezoelectric element 22 deforms in a contracting direction in response to the application of a voltage to the piezoelectric element 22. This deformation causes the diaphragm 21 to bend in a direction of increasing the volume of the liquid chamber 20. Thus, this also increases the amount of ink contained in the liquid chamber 20 having an increased volume. Thereafter, the application of the voltage is stopped to restore the contracted piezoelectric element 22. In this way, the volume of the liquid chamber 20 is restored (reduced), and part of the ink in the liquid chamber 20 is sprayed through the nozzle 24 as droplets E. The droplets E sprayed through the nozzle 24 are applied to a target frame position on the substrate 12.

The buffer tank 14 and the droplet spraying and applying head 13 are connected to each other with the supply pipe 26 which is a supply channel. Through this supply pipe 26, the ink in the buffer tank 14 is supplied to the liquid chambers 20 of the droplet spraying and applying head 13. The supply pipe 26 placed between the buffer tank 14 and the droplet spraying and applying head 13 is passed through a hollow portion (not shown) formed in a region including the rotation center of the revolute joint 18, halfway between the ends thereof. Thus, in the case where the droplet spraying and applying head 13 side of the revolute joint 18 rotates, no influence is exerted on the supply pipe 26. A filter containing portion 27 is provided in a halfway position between the ends of the supply pipe 26. The filter containing portion 27 contains a filter (not shown) for removing foreign matters in ink.

In the above-described constitution, FIG. 1 shows a situation in which the droplet spraying and applying head module 3 is attached to the elevating member 8, and in which the substrate 12 mounted on the substrate holding table 6 is positioned under the droplet spraying and applying head module 3. In this situation, a black frame can be formed at a target position on the substrate 12 by applying voltages to the piezoelectric elements 22 to spray droplets through the nozzle 24, and by driving the moving mechanism 5 to move the substrate 12 in the X-axis direction and Y-axis direction.

In the case where the droplet spraying and applying head module 3 is attached to the elevating member 8, ink is filled into the droplet spraying and applying head module 3 before this attachment. In the case where the ink is filled into the droplet spraying and applying head module 3, bubbles are prone to enter the liquid chambers 20 and the nozzles 24. The bubbles which have entered therein need to be removed. Accordingly, the work of filling the ink into the droplet spraying and applying head module 3 is performed with the droplet spraying and applying head module 3 attached to a filling jig (not shown). In the droplet spraying and applying head module 3 attached to the filling jig, attaching pieces 28 provided on the apparatus fixation portion 15 of the droplet spraying and applying head module 3 are screwed to a rotatable portion of the filling jig, and the buffer tank 14 is held by a holding portion of the filling jig. FIG. 2 shows the posture of the droplet spraying and applying head module 3 attached to the filling jig. It should be noted that the filling jig has a mechanism (not shown) for filling ink, and that this mechanism is connected to a replenishing port 29 of the buffer tank 14.

Figure 4:
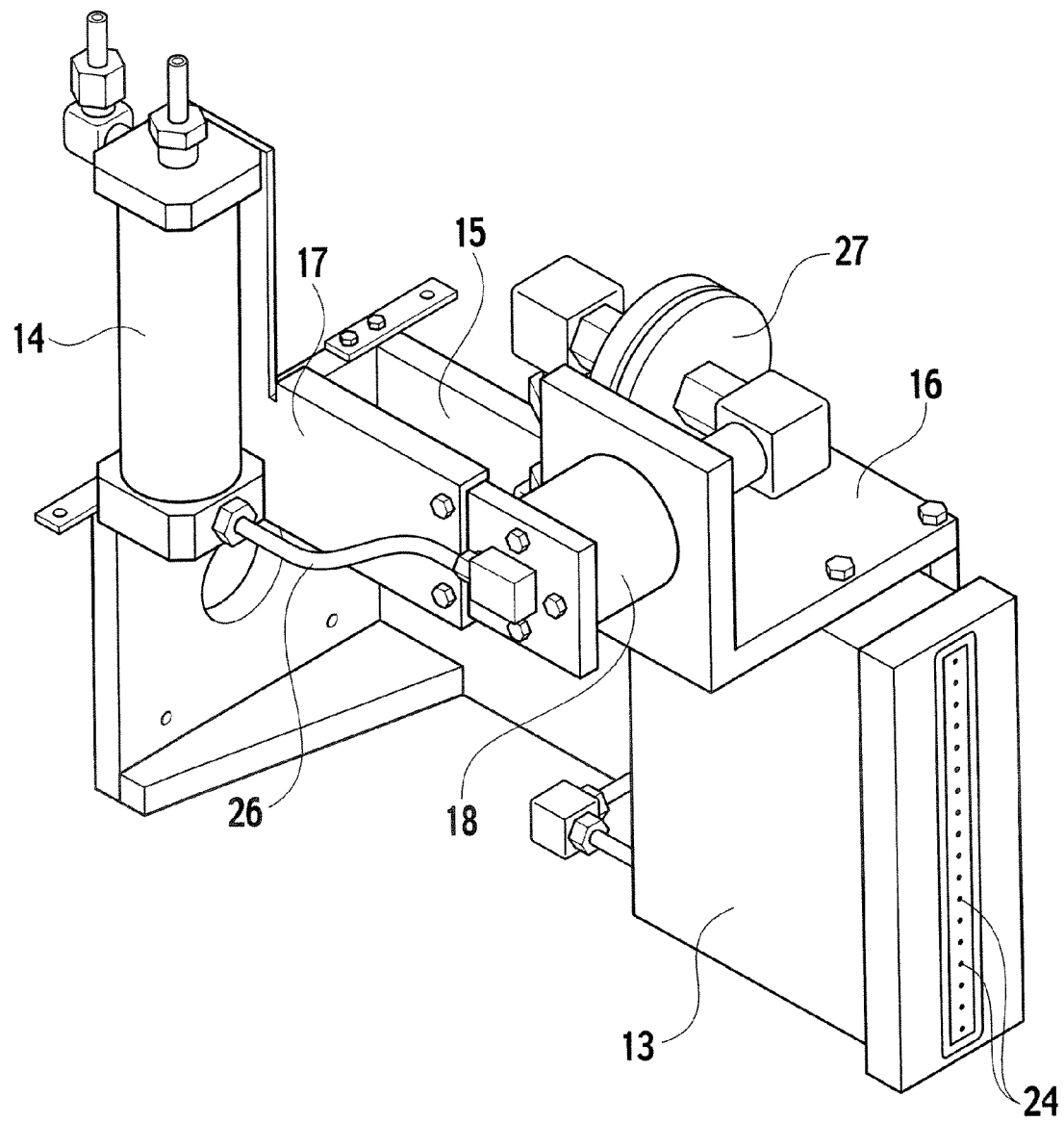
FIG. 4 is a perspective view showing a situation developed from the situation shown in FIG. 2 by rotating the droplet spraying and applying head by 90°, in the droplet spraying and applying head module attached to a filling jig.

FIG. 4 shows a situation developed from that of FIG. 2 by rotating the rotatable portion of the filling jig by 90°. In the droplet spraying and applying head module 3 attached to the filling jig, only the droplet spraying and applying head 13 side of the revolute joint 18 rotates by 90°. The positions of the buffer tank 14 and the coupling member 17 do not change.

Figure 5:
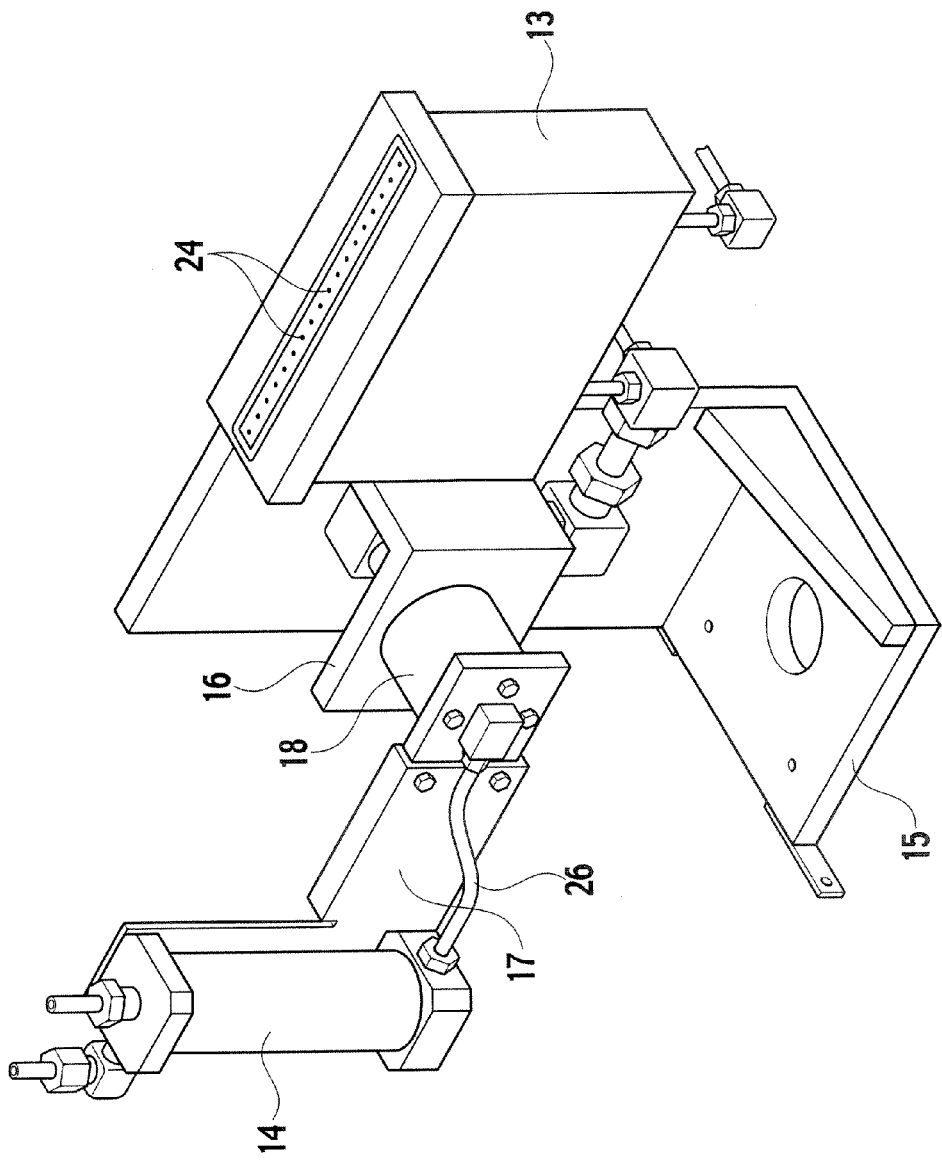
FIG. 5 is a perspective view showing a situation developed from the situation shown in FIG. 4 by rotating the droplet spraying and applying head by 90°, in the droplet spraying and applying head module attached to the filling jig.
Figure 6:
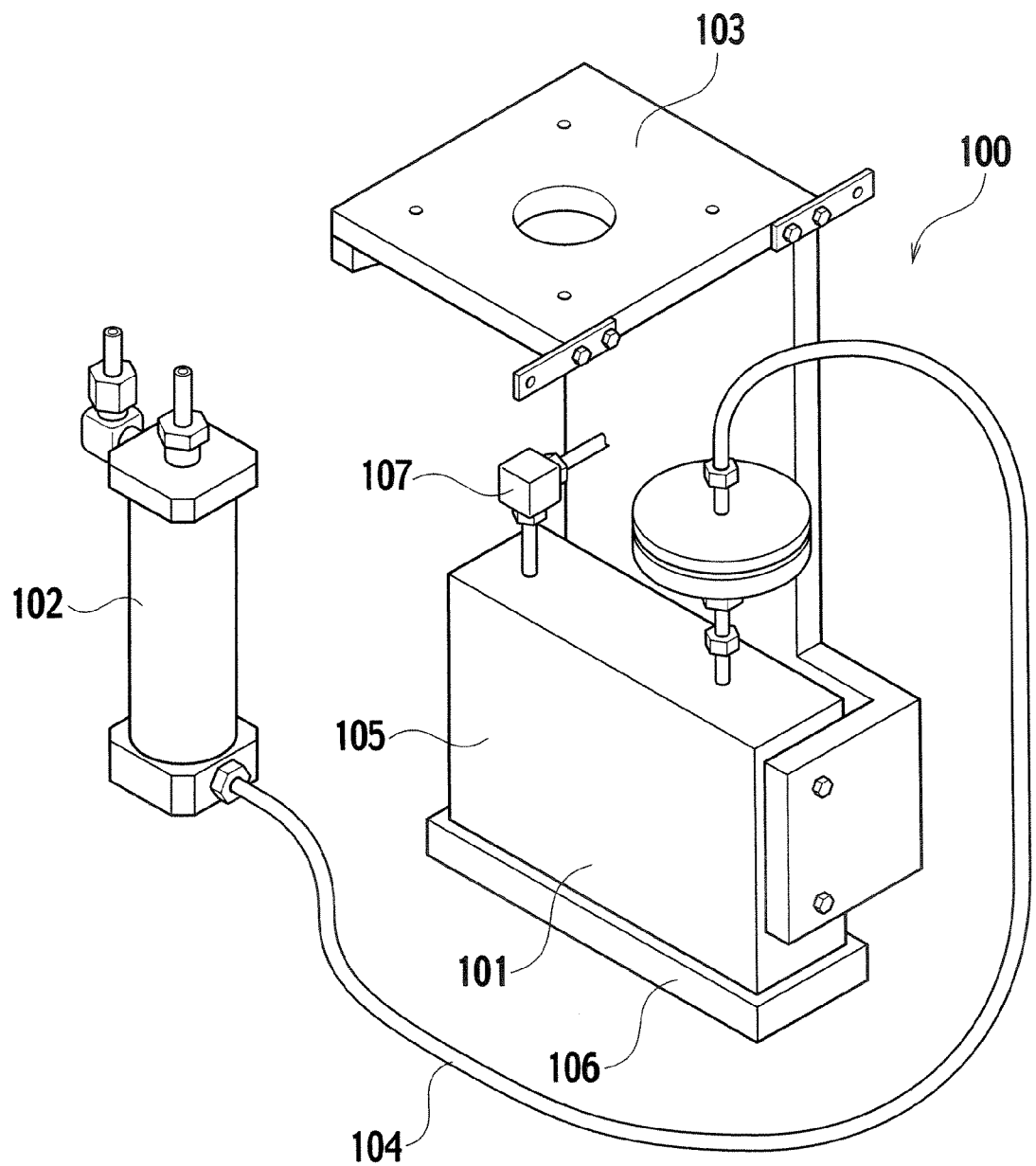
FIG. 6 is a perspective view showing a droplet spraying and applying head module of a conventional example.

FIG. 5 shows a situation developed from that of FIG. 4 by rotating the rotatable portion of the filling jig by another 90° (180° from the situation of FIG. 2). In this case, in the droplet spraying and applying head module 3 attached to the filling jig, only the droplet spraying and applying head 13 side of the revolute joint 18 rotates by another 90°. The positions of the buffer tank 14 and the coupling member 17 do not change.

By rotating the droplet spraying and applying head 13 of the droplet spraying and applying head module 3 attached to the filling jig by 90° from the position shown in FIG. 2 to that shown in FIG. 4, further rotating the droplet spraying and applying head 13 by 90° from the position shown in FIG. 4 to that shown in FIG. 5, and rotating the droplet spraying and applying head 13 by 180° from the position shown in FIG. 5 to that shown in FIG. 2, bubbles existing in the liquid chambers 20 and the nozzles 24 can be moved toward the exhaust port 25. Furthermore, by opening the exhaust port 25 when the exhaust port 25 is located at a position where it points upward as shown in FIG. 2, the bubbles moved to the position of the exhaust port 25 can be expelled outside the droplet spraying and applying head 13.

Moreover, after the bubbles are expelled through the exhaust port 25, the droplet spraying and applying head 13 side is again rotated with the exhaust port 25 closed. Then, the ink in the buffer tank 14 is pressurized at a position where the nozzles 24 point upward as shown in FIG. 5, thus performing a purging process for causing the ink in the liquid chambers 20 and the nozzles 24 to flow out through the nozzles 24. In the case where bubbles exist in the liquid chambers 20 and the nozzles 24, this purging process expels the bubbles.

By performing the bubble expelling process by rotating the droplet spraying and applying head 13 side, and performing the purging process through the nozzles 24, it becomes possible to fill the droplet spraying and applying head module 3 with ink containing no bubbles.

The droplet spraying and applying head module 3 thus filled with ink is detached from the filling jig. Then, the droplet spraying and applying head module 3 detached from the filling jig and filled with ink is attached to the elevating member 8.

In the droplet spraying and applying head module 3, the droplet spraying and applying head 13 and the buffer tank 14 are coupled to each other with the coupling member 17. Accordingly, each of the attachment of the droplet spraying and applying head module 3 to the filling jig, the detachment of the droplet spraying and applying head module 3 from the filling jig, and the attachment of the droplet spraying and applying head module 3 to the elevating member 8 can be easily performed by one operation, while saving work.

In addition, since the revolute joint 18 is provided between the coupling member 17 and the droplet spraying and applying head 13, only the droplet spraying and applying head 13 side of this revolute joint 18 can be rotated. Accordingly, the operation of rotating the droplet spraying and applying head 13 to expel bubbles can be easily performed.

Moreover, the supply pipe 26 placed between the buffer tank 14 and the droplet spraying and applying head 13 is passed through a hollow portion (not shown) formed in a region including the rotation center of the revolute joint 18. Accordingly, the supply pipe 26 can be placed without being affected by the rotation of the droplet spraying and applying head 13, and the piping length thereof can also be reduced. Moreover, reducing the length of the supply pipe 26 makes the supply pipe 26 less prone to hit against the other members during the work of attaching or detaching the droplet spraying and applying head module 3. Thus, it is possible to prevent the pressure of liquid in the droplet spraying and applying head module 3 from fluctuating due to the supply pipe 26 hitting against the other members. Accordingly, it is possible to avoid an occurrence of a phenomenon that this pressure fluctuation causes gas to be sucked in through the tips of the nozzles 24.

In an intermediate portion of the supply pipe 26, a filter is placed. Accordingly, in the case where foreign matters exist in ink, the foreign matters can be removed by the filter. Thus, ink containing no foreign matters can be supplied to the droplet spraying and applying head 13.

The above-described embodiment has been described by taking as an example of the droplet spraying and applying head module 3, which sprays and applies black ink for forming a black frame on the substrate 12 in the case where an organic EL display panel is manufactured, and the droplet spraying and applying apparatus 1, which employs this droplet spraying and applying head module 3. However, the present invention can also be applied to a droplet spraying and applying head module and a droplet spraying and applying apparatus, which are used in the case where color films of three colors (R (red), G (green), and B (blue)) are formed on the substrate 12.

Moreover, the above-described embodiment has been described by taking as an example the case where an organic EL display panel is manufactured as a coated body. However, the droplet spraying and applying head module and the droplet spraying and applying apparatus can also be applied to the case where a liquid crystal display panel is manufactured as a coated body.

What is claimed is:

1. A method of manufacturing a coated body comprising:
   providing a droplet spraying and applying apparatus, the droplet spraying and applying apparatus including:
   a droplet spraying and applying head having a liquid chamber to contain liquid and a plurality of nozzles communicating with the liquid chamber, the droplet spraying and applying head to spray droplets through the nozzles,
   a tank to contain liquid to be supplied to the liquid chamber, the tank communicating with the liquid chamber,
   a droplet spraying and applying head module in which the droplet spraying and applying head and the tank are coupled to each other with a coupling member, and in which a revolute joint is interposed between the coupling member and the droplet spraying and applying head,
   a supporting portion to support the droplet spraying and applying head module, and
   a holding portion to hold a body to be coated with the droplets sprayed through the nozzles;
   filling ink into the droplet spraying and applying head with the droplet spraying and applying head module attached to a filling jig;
   rotating the revolute joint to rotate the droplet spraying and applying head by 360° from a position in which an exhaust port connected to the liquid chamber points upward,
   opening the exhaust port to expel bubbles collected in the exhaust port outside the droplet spraying and applying head;
   rotating the revolute joint again to rotate the droplet spraying and applying head by 180° to a position in which the nozzles point upward;
   causing the ink to flow out from the nozzles; and
   spraying and applying droplets to the body to be coated, by use of the droplet spraying and applying apparatus.

2. A method of manufacturing a coated body comprising:
   providing a droplet spraying and applying apparatus, the droplet spraying and applying apparatus including:
   a droplet spraying and applying head having a liquid chamber to contain liquid and a plurality of nozzles communicating with the liquid chamber, the droplet spraying and applying head to spray droplets through the nozzles, a tank to contain liquid to be supplied to the liquid chamber, the tank communicating with the liquid chamber, a filter arranged in a supply channel through which the liquid in the tank is supplied to the liquid chamber, a droplet spraying and applying head module in which the droplet spraying and applying head and the tank are coupled to each other with a coupling member, and in which a revolute joint is interposed between the coupling member and the droplet spraying and applying head, a supporting portion to support the droplet spraying and applying head module, and a holding portion to hold a body to be coated with the droplets sprayed through the nozzles;

filling ink into the droplet spraying and applying head with the droplet spraying and applying head module attached to a filling jig;

rotating the revolute joint to rotate the droplet spraying and applying head by 360° from a position in which an exhaust port connected to the liquid chamber points upward, opening the exhaust port to expel bubbles collected in the exhaust port outside the droplet spraying and applying head;

rotating the revolute joint again to rotate the droplet spraying and applying head by 180 ° to a position in which the nozzles point upward, causing the ink to flow out from the nozzles; and spraying and applying droplets to the body to be coated, by use of the droplet spraying and applying apparatus.

* * * * *